Figure 1:
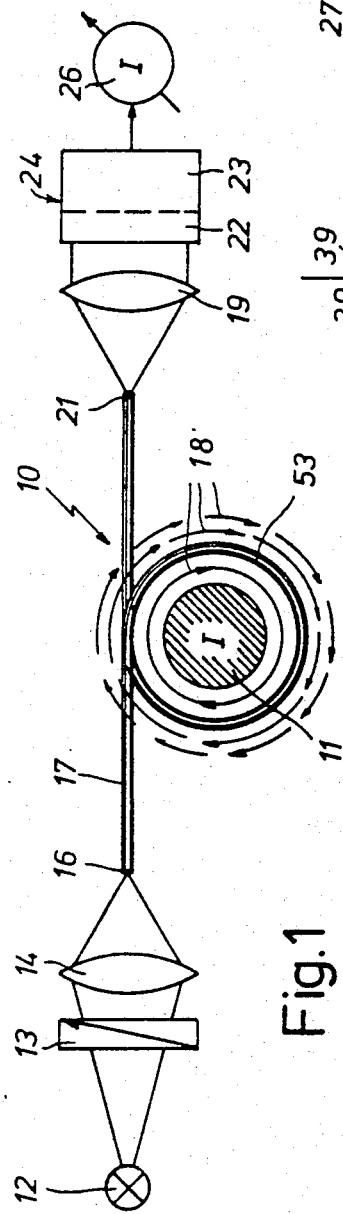

United States Patent [19]
Ulrich et al.

[11] 4,255,018
[45] Mar. 10, 1981

[54] FIBRE OPTICAL ARRANGEMENT FOR MEASURING THE INTENSITY OF AN ELECTRIC CURRENT

[75] Inventors: Reinhard Ulrich, Leonberg, Fed. Rep. of Germany; Scott C. Rashleigh, Sydney, Australia

[73] Assignee: Max-Planck-Gesellschaft zur Forderung der Wissenschaften e.V., Leonberg, Fed. Rep. of Germany

[21] Appl. No.: 66,282

[22] Filed: Aug. 13, 1979

[30] Foreign Application Priority Data

Aug. 16, 1978 [DE] Fed. Rep. of Germany ....... 2835794

[51] Int. Cl.³ .............................................. G01R 15/07
[52] U.S. Cl. ....................................... 350/375; 324/96; 350/96.29
[58] Field of Search ................... 350/150, 151, 96.29; 356/368; 324/96

[56] References Cited

U.S. PATENT DOCUMENTS

| | | | |
|---|---|---|---|
| 3,605,013 | 9/1971 | Yoshikawa et al. | 350/151 |
| 4,070,620 | 1/1978 | Feldtkeller et al. | 350/151 |

OTHER PUBLICATIONS

Papp et al., "Polarization Optics of Index-Gradient Optical Waveguide Fibers," *Applied Optics*, vol. 14, No. 10 (Oct. 1975), pp. 2406-2411.
Papp et al., "Polarization Optics of Liquid-Core Optical Fibers," *Applied Optics*, vol. 16, No. 5 (May 1977), pp. 1315-1319.

*Primary Examiner*—Richard A. Rosenberger
*Attorney, Agent, or Firm*—Cushman, Darby & Cushman

[57] ABSTRACT

A fibre optical arrangement for measuring the intensity of an electric current using the Faraday effect, in which the path of light whose state of polarization is influenced by the magnetic field surrounding the conductor through which current flows is marked by the core of an optical fibre which is coiled round the conductor in a number of turns, the optical fibre used in the arrangement being one which has a circular double refraction $\alpha$ at least of the order of magnitude of a linear double refraction $\beta$ determined by the structure of the fibre and its coiled arrangement. The fibre is preferably twisted about its longitudinal axis so that the twist is substantially evenly distributed over the length of the optical fibre.

14 Claims, 4 Drawing Figures

FIBRE OPTICAL ARRANGEMENT FOR MEASURING THE INTENSITY OF AN ELECTRIC CURRENT

This invention relates to a fiber optical arrangement for measuring the intensity of an electrical current.

The principle according to which such fiber optical arrangements are constructed and function is as follows:

An optical fiber is placed as one or more turns around a conductor carrying a current so that at least components of the magnetic field which is produced by the current flowing through the conductor and which surrounds the conductor extend in the direction of the optical fiber. Monochromatic light having a definite state of polarization is coupled into the fiber. The optical fiber is either a so-called monomodal fiber or a multimodal fiber operated in its fundamental mode. A luminous flux propagating in the longitudinal direction of the fiber can therefore be defined as two luminous fluxes polarised orthogonally to each other. Due to the Faraday effect, the magnetic field, which is proportional to the current, causes the light propagating along the fiber to undergo a rotation of its plane of polarization. This rotation is proportional to the length of the path of light exposed to the magnetic field and the intensity of the magnetic field component acting in the direction in which the light propagates, and is therefore a measure of the intensity of current in the electric conductor. It can be measured by means of an analyser and photoelectric detector system since a change in the state of polarization leads to a charge of the output signal of the photoelectric detector system. For example, the two luminous fluxes having orthogonal states of polarization can be separated by means of a Wollaston prism or equivalent arrangement and transmitted to detectors which are arranged spatially separate from each other and whose output voltages are $V_1 = B \cos \phi$ and $V_2 = B \sin \phi$ where B is the intensity of light and $\phi$ the angular position of the plane of polarization relative to the axes of the Wollaston prism. An electronic evaluation system processing the voltages $V_1$ and $V_2$ can then produce an output signal proportional to the change in the azimuth $\phi$ and hence proportional to the current to be measured.

In spite of the simplicity of this concept, apparatus for putting it into practice is difficult to produce because optical fibers, in particular solid core fibers, have a linear intrinsic double refraction due to the fact that such fibers cannot be produced with an ideally circular cross-section over their whole length. Furthermore it is also difficult to manufacture optical fibers which are completely free from inner stress. This intrinsic double refraction, together with the Faraday effect which manifests as rotational double refraction $\alpha_H$, results in an elliptical double refraction, but could possibly be accepted in cases where the influence of the linear intrinsic double refraction $\beta$ over the length l of the fiber is sufficiently small, for example when $|\beta \cdot l| < \pi/2$.

It has therefore been proposed for arrangements of the type mentioned above to use liquid core fibers which have a solid cladding and a liquid core. Such liquid core fibers can be produced with only minor deviations of their cross-section from the ideal circular form and can be produced without any double refraction due to stress because such a phenomenon cannot occur in the liquid which forms the core. However, liquid core fibers are not only expensive to manufacture but also difficult to handle since they require special measures to ensure that the liquid forming the core cannot flow out.

Since the rotation of the plane of polarization of measuring light due to the Faraday effect is proportional to the length of the path of light exposed to the magnetic field, it is desirable for a high accuracy of measurement in the current measuring arrangements of the type mentioned initially to obtain long paths of light in the magnetic field produced by the current which is to be measured. One method of achieving this would be to use an optical fiber which marks the path of light and form it into a coil having a plurality of directly adjacent turns round the conductor whose current is to be measured. For the purpose of the best possible utilisation of the effective magnetic field, the most suitable arrangement of the fiber would be that in which it is formed with the closest possible turns arranged in the direction of the magnetic field surrounding the conductor which carries the current.

Such a coiled arrangement of the optical fiber would, however, induce a considerable linear double refraction in this fiber due to the change in cross-section produced by bending the fiber, and this double refraction would reduce the Faraday effect so that in some cases this effect, which is proportional to the current, could not even be measured or clearly recognised.

In the case of liquid core fibers (Applied Optics, May 1977, Vol. 16, No 3, page 1315 et seq), it is known that this double refraction due to bending can be largely compensated for by using special forms of winding the optical fiber. The most advantageous of these for measuring a current is a butterfly form winding of the fiber in which one or more turns of the fiber are placed alternately in planes of the fiber at right angles to each other.

One disadvantage of using such butterfly turns, however, is that it is then only possible to compensate for the double refraction due to bending but not for the intrinsic double refraction, so that this arrangement of turns would only be suitable for fibers which have a very low intrinsic double refraction. Another disadvantage is that the amount of space taken up by the butterfly turns in the longitudinal direction of the conductor is comparatively large, being at least equal to $\sqrt{2}$ times the diameter of the turns and furthermore, as a result of this arrangement, the magnetic field of the current flowing through the conductor does not act with its full intensity in the direction of the fiber but only with one component.

It is therefore an object of the present invention to provide a fiber optical arrangement of the type defined above in which, regardless of the geometry of the fiber winding, the interfering effect of the intrinsic double refraction and/or double refraction due to bending of the fiber can be eliminated at least to such an extent that the current can be measured sufficiently accurately by means of the Faraday effect.

According to the invention, there is provided a fiber optical arrangement for measuring the intensity of an electric current using the Faraday effect, in which the path of light for the light whose state of polarization is influenced by the magnetic field surrounding the conductor through which current flows is marked by the core of an optical fiber which is coiled round the conductor in a number of turns, the optical fiber used in the arrangement being one which has a circular double refraction $\alpha$ at least of the order of magnitude of a linear double refraction $\beta$ determined by the structure of the fiber and its coiled arrangement.

At least the following advantages are thereby achieved with such an arrangement:

The effect of the strong circular double refraction $\alpha_r$ is that the total amount of linear double refraction $\beta$ can now be regarded purely as a disturbance of the total amount of circular double refraction so that it no longer has any significant influence on the Faraday effect, which can therefore come into its full effect. The more marked this circular double refraction, the more complete is the suppression of the influence of linear double refraction which might otherwise mask the circular double refraction induced by the Faraday effect. For practical purposes, it may be perfectly sufficient to have a circular double refraction of the same order of magnitude as the total amount of linear double refraction present. Since the amount of the circular double refraction is constant, it does not interfere with the measurement of a Faraday effect which manifests itself as a circular double refraction which is variable because proportional to the current.

According to one embodiment of the invention, the required circular double refraction is obtained by making the core of the optical fiber of an optically active crystalline material whose optical axis extends in the direction of the fiber axis.

According to an alternative embodiment of the invention, the arrangement may utilise a liquid core fiber in which the material used for the core is either an optically active liquid or an optically inactive liquid to which an optically active liquid is added. One may, of course, also use a solution of an optically active solid material. In the last two cases mentioned, the amount of circular double refraction can be varied within wide limits.

In a preferred embodiment of the invention, the optical fiber is a solid core fiber which has the required circular double refraction $\alpha$ imposed on it by being twisted about its longitudinal axis. In this case, the given amount of circular double refraction can easily be varied by the degree of twisting of the fiber. This method of producing circular double refraction has the advantage of exceptionally low sensitivity to temperature.

Since the circular double refraction of the optical fiber obtained by these methods leads to the desired result regardless of the geometry of the winding of the fiber the optical fiber may also surround the current carrying conductor in the manner of a tightly wound coil whose turns are arranged directly side by side and optionally one above the other and in parallel planes which are substantially at right angles to the longitudinal axis of the conductor. Such an arrangement is optimal both in taking up very little space and in providing the most efficient utilisation of the magnetic field surrounding the conductor which carries the current.

Since the most important condition to observe for correct functioning of the fiber optical arrangement according to the invention is that the changes in polarization due to the intrinsic double refraction should not increase unduly, it is in principle sufficient for obtaining the circular double refraction to twist the optical fiber over parts of its length only. For reasons of mechanical stability and, as practical experiments have shown, also for optical reasons, however, it is best if the twist is distributed uniformly over the length of the fiber.

The invention also includes a process for the production of a twisted fiber optical arrangement including imparting the twist to the optical fiber in adjacent partial lengths by fixing the beginning of each fiber section to a support, twisting the section thus fixed and fixing the other end thereof to the support and that section of the same or of another partial length of optical fiber which is adjacent to the fixed point being then twisted and having its end again fixed to the support so that it can no longer be twisted. Preferably, the method includes eliminating the attachment between the optical fiber and the support at the points of attachment situated between the beginning and end of the twisted fiber length when the fiber has been directly placed on the support and has been fixed and secured against twisting on the support at its point of attachment remote from the first point of attachment. In such a case, an adhesive which can be softened by heat and/or dissolved chemically may be used for fixing the optical fiber to the points of attachment situated between the beginning and end of its twisted length. In this manner uniform distribution or equalisation of the degree of twist over the whole length of the optical fiber can easily be achieved even if the fiber has previously been fixed to a support in such a manner that it has different degrees of twist in different sections.

The invention also includes a further process for producing a twisted fiber optical arrangement, the arrangement having a spirally wound fiber with m turns and a twist at one end relative to its beginning of $n \times 360°$, the process including fixing the fiber at one end, and twisting it in the stretched state at its other end $(n+m)$ times through 360° and using the torsional stress thereby produced to produce the m turns of the coil. This process provides a useful means of utilising the potential energy stored by twisting the fiber to effect spontaneous coiling of the fiber. The process may be characterized by the following features:

(a) one end of the optical fiber is attached in such a manner to one of the supporting elements at one end of a support which comprises, as supporting elements, rigid rods, stretched wires or threads extending along the edges of a prismatoid, the effective cross-section of which support can be increased by moving the supporting elements apart in the radial direction, that at its point of attachment the fiber can be pivoted about an axis extending radially to the longitudinal axis of the prismatoid but is held so that it cannot be turned about its longitudinal axis;

(b) the fiber is twisted n times while stretched, and thereafter, while the prismatoid is adjusted to its smallest cross-section, the fiber is placed spirally in m turns with a high thread pitch around the support, the free end of the fiber being carried round the support in such a manner that the same side of the circumferential surface of the end of the fiber is constantly facing the support, in order that the m subsequent turns through 360° will be imparted to the fiber;

(c) the free end of the fiber, which has thus been twisted $(n+m)$ times in relation to that end of the fiber which is already attached to the end of the support, is now fixed again to a part which can be displaced along one of the supporting elements, so that this end of the fiber, though capable of following a change in the pitch of the turns, cannot rotate about the axis of the fiber;

(d) then, while the distance between the ends of the fiber successively shortens and at the same time the radial distance of the supporting elements from the longitudinal axis of the support increases, the fiber turns, which correspondingly increase in diameter, are pushed together until they are in direct contact with each other.

The invention also includes another process for producing a twisted optical fiber arrangement in which the fiber is carried round a core and has a given number of turns, the diameter of the turns being initially selected to be somewhat greater than the diameter of the core, and the free end of the fiber whose other end is non-rotatably attached to the support being then turned until the required degree of twist is obtained along the fiber, and the fiber is then stretched so that it is in direct contact with the support and the free end of the fiber is then also attached to the support so that it can no longer be twisted.

A detailed description of the invention has been published in Applied Physics Letters Vol. 34, p. 768–770, June 1, 1979, to which reference is made.

Figure 3:
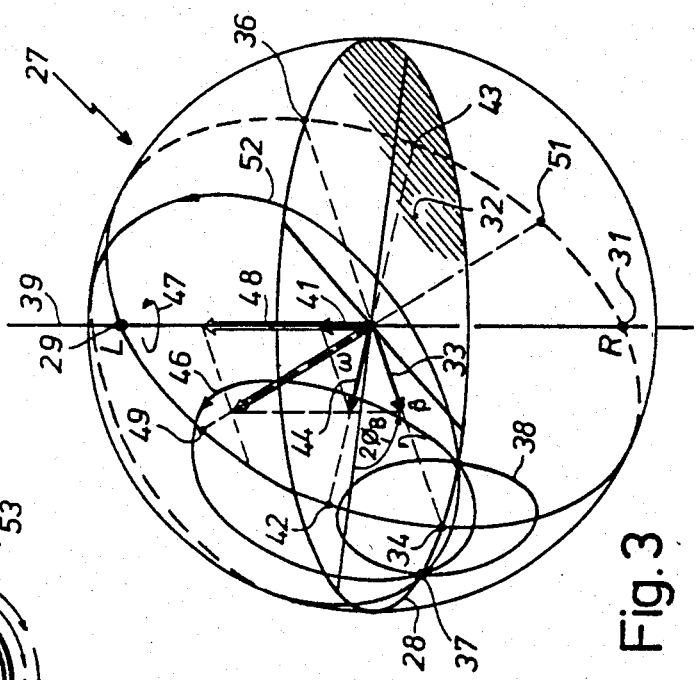
Figure 2:
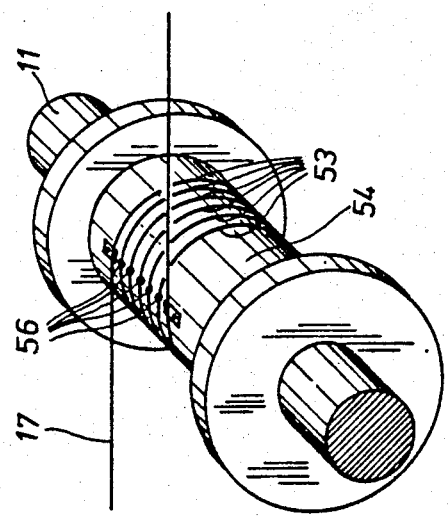
Figure 4:
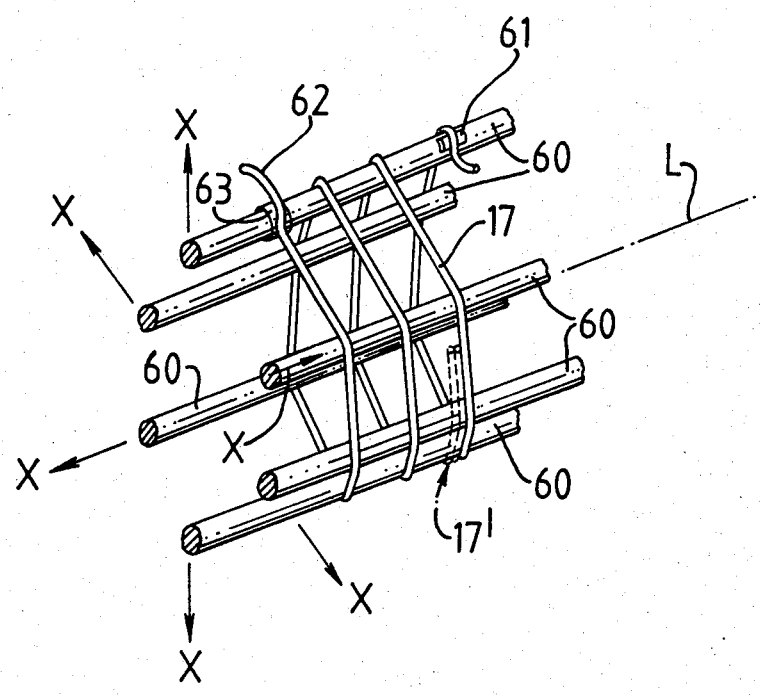

Further details and features of the invention will now be described by way of example with reference to the accompanying drawings, in which FIG. 1 is a schematic representation of a fiber optical arrangement according to the invention for measuring a current, FIG. 2 shows the formation of the fiber winding on a support surrounding the conductor which carries the current, FIG. 3 represents a Poincare sphere to explain the state of polarization of the light used in the arrangement of FIG. 1 and FIG. 4 is a schematic view of part of a prismatoidal support used in the formation of a coil.

FIG. 1 illustrates the known, basic construction of a fiber optical arrangement 10 which can be used for measuring the intensity of an electric current I flowing through a conductor 11 by means of the magneto-optical Faraday effect.

As shown in FIG. 1, this arrangement comprises a source of light 12 emitting a bundle of light, a polariser 13 which selects from this bundle a partial bundle having a defined linear polarization, a focussing lens 14 with which the light which is in the defined state of polarization can be coupled into an optical fiber 17 by being introduced at its input end 16, this fiber 17 forming the central component of the arrangement.

The optical fiber 17 is exposed at least over a substantial portion of its length to the magnetic field H which is associated with the current I flowing through the conductor 11 and which is represented by arrows 18. The optical fiber 17 is placed round the conductor 11 in such a manner that at least components of the magnetic field H act in the longitudinal direction of the fiber. A collimator lens 19 is provided by means of which the beam of light emerging from the exit 21 of the optical fiber 17 in an altered state of polarization can be transmitted to an evaluation unit 24 substantially consisting of an analyser 22 and a photoelectric detector system 23. This evaluation unit 24 produces an electric output signal which is characteristic of the altered state of polarization and which is indicated by a measuring instrument 26 calibrated in units of electric current.

The optical fiber 17 is a so-called weakly guiding monomodal fiber, i.e. the luminous flux propagating along the fiber can be described as two plane waves of a certain type of vibration polarised orthogonally to each other. By "weakly guiding" is meant that the refractive index of the optical fiber core which marks the path of light and the refractive index of the surrounding fiber cladding, which has the lower refractive index, differ only very little from each other (only of the order of 0.5%).

Such an optical fiber may have a solid core of quartz glass, for example, or a liquid core with only the cladding made of glass.

In a plane lightwave with linear polarization, the Faraday effect manifests as a rotation of its plane of polarization through the angle $\alpha H/2 \cdot l$, where $$\alpha H/2 = VH,$$

and l is the length of the path of light along which the light is exposed to a magnetic field H in the direction in which the light propagates and V is a material constant (Verdet's constant) characteristic for the medium in which the light propagates, this constant being small for the usual fiber materials. It is therefore desirable for accuracy of measurement to obtain a very long path of light, and this can only be achieved within a reasonably small space if the optical fiber is coiled.

In such a coil arrangement, for example the winding represented in FIG. 2, however, a linear double refraction $\beta$ occurs in the fiber, at least as a result of the inevitable alteration in the cross-section of the fiber 17, and this double refraction reduces the Faraday effect. To compensate for or suppress this undesirable effect, the optical fiber 17 provided according to the invention is one which has a circular double refraction $\alpha$ having at least the same order of magnitude as the total amount of linear double refraction in the fiber and possibly being substantially greater.

The effect of this additional circular double refraction on the magnitude of the Faraday effect which also manifests as a circular double refraction will now be explained with specific reference to the details shown in FIG. 3.

FIG. 3 is a representation of a so-called Poincare sphere 27 in which linear states of polarization are represented by points on the equator 28, the two possible circular states of polarization by the north pole 29 (left circular polarization L) and the south pole 31 (right circular polarization R) and the elliptical states of polarization are represented by the other points on the surface of the sphere. All kinds of birefurigence can be represented as rectors indicating a rotation of the states of polarization about this sphere.

A linear double refraction in the optical fiber 17 can be represented by a vector 33 situated in the equatorial plane 32, the direction $2\phi_B$ of which vector marks the linear eigen states of polarization represented by the two points 34 and 36 which are such that when they are coupled into the optical fiber 17, no change in the state of polarization would occur over its length if only that linear double refraction represented by the vector 33 were present, the length of the vector 33 being a measure of this double refraction. If, on the other hand, light with a different state of polarization is coupled into the optical fiber 17, for example light with the state of polarization represented by the point 37 on the equator 28, then the states of polarization successively occurring along the optical fiber 17 lie on a circle 38 which is travelled over repeatedly along the optical fiber 17 at an "angular velocity" $\beta$ which is all the higher the greater the linear double refraction.

A circular double refraction $\alpha$ impressed on the optical fiber 17 or produced in some other manner and, of course, also the circular double refraction $\alpha_H$ induced by the Faraday effect may be analogously characterized by a vector 41 extending in the direction of the polar axis 39 of the Poincaré sphere 27.

When both a linear double refraction $\beta$ characterized by the vector 33 and a circular double refraction $\alpha$ represented by the vector 41 are present, in other words when there is the overall effect of an elliptical double refraction, then the corresponding elliptical polarization Eigen states represented by the points 42 and 43 are marked by the direction of the resulting vector 44 whose length is again a measure of the elliptical double refraction $\omega$. This vector 44 is the sum of the angular velocity vectors 33 and 41 of the linear and circular double refraction. The states of polarization which occur successively along the fiber when the input state of polarization 37 is coupled into the optical fiber 17 then lie on the circle 46 with centre 42.

According to FIG. 3, the Faraday effect manifests as a rotation of all the states of polarization about the polar axis 39 proportional to the current, for example about the direction of the arrow 47. In real cases, this rotation is of the order of an angle of one minute of arc per centimeter of fiber length.

If the linear or elliptical double refraction of the optical fiber 17 is sufficiently pronounced, the evolution of polarization along the optical fiber corresponds to a large number of circuits round the circles 38 or 46. As can be seen from FIG. 3, the change represented by these circles 38 or 46 is opposed in the "upper" half of the circumference of each circle by the change in state of polarization produced by the Faraday effect alone, and it is only in the "lower" half of each circle that the change represented by the circle and the change in state of polarization produced by the Faraday effect act in the same direction. The overall effect is therefore a reduction in the amount of change in state of polarization which can be used for measuring the current. When the optical fiber used in an arrangement for measuring current has a relatively strong linear double refraction, this reduction in the change in state of polarization results in a corresponding reduction in sensitivity.

If, on the other hand, the optical fiber has a circular double refraction $\alpha$ whose magnitude, represented by the vector 48 in FIG. 3, is comparable to that of the linear double refraction $\beta$ (vector 33) or even considerably greater, so that the resulting polarization Eigen states represented by the points 49 and 51 are "closer" to the poles 29 and 31 of the Poincaré sphere 27, then the circle 52 which describes the evoluton of polarization along the optical fiber 17 and which may, for example, start from the input polarization state 37, will circumscribe the polar axis 39, and the changes in the state of polarization produced by the double refraction properties of the optical fiber 17 and by the Faraday effect both act in the same direction. In the event of the optical fiber 17 having a circular double refraction $\alpha$ considerably greater than its linear double refraction, the circle which describes the evolution of the polarization will lie close to the equator 28, in which case the sensitivity of the fiber optical arrangement according to the invention is optimised.

The linear double refraction results from an intrinsic double refraction $\beta_i$ and the bending double refraction $\beta_b$ produced by curvature of the fiber. Due to the twist in the fiber 17, the linear double refraction $\beta$ which is the resultant of the intrinsic double refraction $\beta_i$ and the beding double refraction $\beta_b$ changes continuously along the fiber so that on average only the greater of the two amounts is effective.

Sufficient supression of the influence of linear double refraction $\beta$ for practical purposes is achieved when the circular double refraction $\alpha$ is of the same order of magnitude as the larger of the amount $\beta_i$ and $\beta_b$.

It has been found experimentally that the circular double refraction $\alpha_{96}$ produced by a twist $\tau$ is proportional to the twist according to the relationship:

$$\alpha_\tau = g \cdot \tau$$

where $\tau$ is the degree of twist in rad/m and g is the proportionality constant, which for glass fibers is in the range of 0.13 to 0.16.

In an experimental construction of a fiber optical arrangement 10, the optical fiber 17 used was a quartz glass fiber in which the circular double refraction $\alpha$ provided according to the invention was produced by twisting the fiber about its longitudinal axis. The fiber had a length of 8.9 m and was wound on a core 54 of acrylic glass in 47 contiguous turns 53, only six of which are represented in FIG. 2. The conductor 11 carrying the current extended through this spool core 54, as illustrated in FIG. 2. The diameter of the individual turns 53 was 6 cm and the length of the fiber coil in the longitudinal direction of the spool coe 54 was ca. 1 cm so that the individual turns were situated in planes virtually at right angles to the direction of the current 1 and the magnetic field 18 coaxially surrounding the conductor 11 acted in the longitudinal direction of the optical fiber 17 with virtually its full strength existing at the locality of the turns of the fiber. The fiber had a linear intrinsic double refraction $\beta_i$ of ca. 2 radians per meter of fiber length. The bending double refraction $\beta_b$ produced by bending of the fiber and substantially proportional to the curvature of the turns was ca. 4.8 rad/m. The exit end 21 of the optical fiber 17 had been turned through approximately 94 full rotations in relation to the input end 16. The twist in the fiber 17 thus amounted to 66 rad/m and the circular double refraction $\alpha_\tau$ thereby artificially imposed on the fiber was ca. 8.6 rad/m, which amounts to almost double the total linear double fraction $\beta$ present.

In order to obtain the most uniform possible distribution of the twist in the whole coiled fiber, the fiber was non-rotatably fixed to the spool core 54 at the beginning of the coil and a portion of the optical fiber equal in length to the circumference of the core was then twisted by the required amount, placed round the core 54 and then non-rotatably fixed to the core 54 at its end by means of an adhesive which is softened by heat (glycol phthalate). The subsequent turns were then placed over the core 54 of the spool with the required degree of twist $\tau$ in the same manner. It was only at the beginning and end of the coil that the optical fiber 17 was fixed completely non-rotatably to the core 54. At the other points of attachment 56 between the ends, the non-rotatable attachment of the fiber 17 to the core 54 could be eliminated by heating or by removal of the adhesive with a solvent, so that any differences in the degree of twist in the individual turns 53 could be corrected.

An optical fiber may be twisted to form a spirally would fiber coil with M turns and a twist at the end of the fiber relative to its beginning of n·360°. The fiber is preferably fixed at one end and twisted in a stretched state n+m times at its other end through 360°. The torsion created in the fiber assists in the formation of the m.turns of the coil.

If desired, the support for the fiber 17 may comprise rigid rods 60 (FIG. 4) stretched wires or threads extending along the edges of a prismatoid, the effective cross-section of which can be increased by moving the rods, wires or threads radially apart as indicated at X. At its point of attachment 61 to a rod 60 the fiber 17 can be pivoted about an axis extending radially to the longitudinal axis L of the prismatoid but is held so that it cannot be turned about its longitudinal axis. The fiber is then stretched, it is twisted n times and, with the prismatoid adjusted to its smallest cross-section, wound spirally m turns around the support with high thread pitch. The free end 62 of the fiber is carried around the support so that the same side of the circumferential end of the fiber is constantly facing the support in order that the m subsequent turns through 360° will be imparted to the fiber. The free end of the fiber which has been twisted (n+m) times in relation to the fixed end is then fixed to an element 63 which can be displaced along one of the rods 60. Therefore the end of the fiber fixed to element 63 is capable of following a change in pitch of the turns but cannot rotate about the axis of the fiber. The support is then radially expanded while the distance between the ends of the fibers shortens and the turns move into direct contact with each other as partly indicated in broken lines at 17'.

In an alternative method of applying twist to the fiber, one end of the fiber may be fixed to the support 54. A given number of turns are then formed having a diameter slightly larger than that of the support 54. The free end of the fiber is then twisted until the required degree of twist is obtained along the fiber and the fiber is then stretched so as to urge the turns into direct contact with the support. The free end of the fiber is then fixed to the support so that it can no longer be twisted.

The source of light used was a gas laser emitting red light. The diameter of the core of the optical fiber was ca. 5μm. The degree of polarization of the light coupled into the fiber was greater than 99.8%. The analyser used was a Soleil-Babinet compensator combined with a linear analyser. In this arrangement, the output signal of the evaluation unit 24 is proportional to $\cos^2(\Theta/2)$ where $\Theta$ is the angle through which the Poincare sphere 27 (FIG. 3) turns in the direction of the arrow 47 under the influence of the magnetic field which is proportional to the current.

The proportionality between the angle of rotation $\Theta$ and the intensity of the current measured in this arrangement was $0.6 \cdot 10^{-3}$ rad/A. With a current intensity of 430 A, a rotation $\Theta$ of the Poincare sphere through ca. 8.8° was obtained, corresponding to a rotation of the plane of polarization through 4.4°.

We claim:

1. A fiber optical arrangement for measuring the intensity of an electric current using the Faraday effect, in which the path of light for the light whose state of polarization is influenced by the magnetic field surrounding the conductor through which current flows is marked by the core of an optical fiber which is coiled round the conductor in a number of turns, the optical fiber used in the arrangement being one which has a circular double refraction $\alpha$ at least of the order of magnitude of a linear double refraction $\beta$ determined by the structure of the fiber and its coiled arrangement.

2. A fiber optical arrangement according to claim 1, in which the core of the optical fiber consists of crystalline, optically active material having its optical axis extending in the direction of the axis of the fiber.

3. A fiber optical arrangement according to claim 1, in which the optical fiber is a liquid core fiber whose core liquid is optically active or contains optically active additives.

4. A fiber optical arrangement according to claim 1, in which the optical fiber is a solid core fiber which has the required circular double refraction $\alpha$ imposed on it by being twisted about its longitudinal axis.

5. A fiber optical arrangement according to claim 4 in which the axial twist in rad/m is chosen according to the following relationship:

$\tau > 3\beta/g$ wherein $\beta$ is the linear double refraction in rad/m resulting from the structure of the fiber and its coiled arrangement and g is a material constant which in the case of quartz glass has a value in the range of 0.13 to 0.16.

6. A fiber optical arrangement according to claim 4 in which the twist is uniformly distributed over the length of the optical fiber.

7. A process for the production of a fiber optical arrangement according to claim 4 including imparting the twist to the optical fiber in adjacent partial lengths by fixing the beginning of each fiber section to a support, twisting the section thus fixed and fixing the other end thereof to the support, and that section of the same or of another partial length of optical fiber which is adjacent to the fixed point being then twisted and having its end again fixed to the support so that it can no longer be twisted.

8. A process according to claim 7, including eliminating the attachment between the optical fiber and the support at the points of attachment situated between the beginning and end of the twisted fiber length when the fiber has been directly placed on the support and has been fixed and secured against twisting on the support at its point of attachment remote from the first point of attachment.

9. A process according to claim 8, in which an adhesive which can be softened by heat and/or dissolved chemically is used for fixing the optical fiber to the points of attachment situated between the beginning and end of is twisted length.

10. A fiber optical arrangement according to claim 1 in which the circular double refraction is at least three times greater than the linear double refraction of the optical fiber.

11. A fiber optical arrangement according to claim 1 in which the optical fiber surrounds the current carrying conductor in the manner of a tightly wound coil whose turns are arranged directly side by side and optionally one above the other and in parallel planes which are substantially at right angles to the longitudinal axis of the conductor.

12. A process for the production of a fiber optical arrangement according to claim 11, having a spirally wound fiber with m turns and a twist at the end of the fiber relative to its beginning of n·360°, including fixing the fiber at one end, and twisting it in the stretched state at its other end (n+m) times through 360° and using the torsional stress thereby produced to produce the m turns of the coil.

13. A process according to claim 12, in which;
 (a) one end of the optical fiber is attached in such a manner to one of the supporting elements at one end of a support which comprises, as supporting elements, rigid rods, stretched wires or threads extending along the edges of a prismatoid, the effective cross-section of which support can be increased by moving the supporting elements apart in the radial direction, that at its point of attachment the fiber can be pivoted about an axis extending radially to the longitudinal axis of the prismatoid but is held so that it cannot be turned about its longitudinal axis;

(b) the fiber is twisted n times while stretched, and thereafter, while the prismatoid is adjusted to its smallest cross-section, the fiber is placed spirally in m turns with a high thread pitch around the support, the free end of the fiber being carried round the support in such a manner that the same side of the circumferential surface of the end of the fiber is constantly facing the support, in order that the m subsequent turns through 360° will be imparted to the fiber;

(c) the free end of the fiber, which has thus been twisted (n+m) times in relation to that end of the fiber which is already attached to the end of the support, is now fixed again to a part which can be displaced along one of the supporting elements, so that this end of the fiber, though capable of following a change in the pitch of the turns, cannot rotate about the axis of the fiber;

(d) then, while the distance between the ends of the fiber successively shortens and at the same time the radial distance of the supporting elements from the longitudinal axis of the support increases, the fiber turns, which correspondingly increase in diameter, are pushed together until they are in direct contact with each other.

14. A process for the production of a fiber optical arrangement according to claim 11 in which the fiber is carried round a core and has a given number of turns, the diameter of the turns being initially selected to be somewhat greater than the diameter of the core, and the free end of the fiber whose other end is non-rotatably attached to the support being then turned until the required degree of twist is obtained along the fiber, and the fiber is then stretched sp that it is in direct contact with the support and the free end of the fiber is then also attached to the support so that it can no longer be twisted.

* * * * *